(12) United States Patent
Gouin et al.

(10) Patent No.: US 11,108,223 B2
(45) Date of Patent: Aug. 31, 2021

(54) ABNORMAL IMPEDANCE FAULT ISOLATION

(71) Applicant: JOHNSON CONTROLS FIRE PROTECTION LP, Boca Raton, FL (US)

(72) Inventors: Alexandre Gouin, Sainte Basile le Grand (CA); Sébastien Choquette, Beloeil (CA)

(73) Assignee: JOHNSON CONTROLS FIRE PROTECTION LP, Boca Raton, FL (US)

( * ) Notice: Subject to any disclaimer, the term of this patent is extended or adjusted under 35 U.S.C. 154(b) by 70 days.

(21) Appl. No.: 16/413,274

(22) Filed: May 15, 2019

(65) Prior Publication Data

US 2020/0366084 A1 Nov. 19, 2020

(51) Int. Cl.
| | |
|---|---|
| *H02H 3/08* | (2006.01) |
| *H02H 3/16* | (2006.01) |
| *H02H 1/00* | (2006.01) |
| *G01R 19/165* | (2006.01) |
| *H03K 5/24* | (2006.01) |
| *G01R 31/50* | (2020.01) |
| *G01R 31/08* | (2020.01) |

(52) U.S. Cl.
CPC .......... *H02H 3/08* (2013.01); *G01R 19/16571* (2013.01); *G01R 19/16576* (2013.01); *G01R 31/08* (2013.01); *G01R 31/50* (2020.01); *H02H 1/0007* (2013.01); *H02H 3/16* (2013.01); *H03K 5/24* (2013.01)

(58) Field of Classification Search
CPC ........ H02H 3/16; H02H 1/0007; H02H 3/027; H02H 3/093; H02H 3/08; H02H 3/20; H02H 3/202; H02H 7/26; H02H 7/267; H02H 7/268; H02H 3/042; H02H 3/081; G01R 31/50; G01R 19/16576; G01R 19/16571; G01R 31/08; H03K 5/24
See application file for complete search history.

(56) References Cited

U.S. PATENT DOCUMENTS

| | | | |
|---|---|---|---|
| 5,400,203 | A | 3/1995 | Lee |
| 6,100,757 | A | 8/2000 | Kotzamanis |
| 6,826,027 | B2 | 11/2004 | Galgay |
| 8,675,324 | B2 | 3/2014 | Noguchi |
| 9,153,968 | B2 | 10/2015 | Meah et al. |
| 2004/0057181 | A1 | 3/2004 | Marino |
| 2004/0153215 | A1* | 8/2004 | Kearney ............... H02H 3/063 700/293 |
| 2012/0098517 | A1* | 4/2012 | Esumi ..................... H02H 3/08 323/311 |

(Continued)

*Primary Examiner* — Alex Torres-Rivera
(74) *Attorney, Agent, or Firm* — Arent Fox LLP (57) ABSTRACT

In an aspect, a fire detection system is described. The first detection system may include isolation circuit having an isolation switch coupled with a system line of the fire detection system and configured to isolate a first side of the system line from a second side of the system line. The isolation circuit may also include a controller coupled with the isolation switch. The controller may be configured to detect a short circuit on the system line and control the isolation switch based on a calculated impedance on the system line in response to detecting the short circuit.

16 Claims, 4 Drawing Sheets

(56) References Cited

U.S. PATENT DOCUMENTS

| | | | |
|---|---|---|---|
| 2012/0293017 A1* | 11/2012 | Lidsky | H02H 3/087 307/126 |
| 2014/0092505 A1* | 4/2014 | Norris | G01R 1/203 361/56 |
| 2016/0072269 A1* | 3/2016 | Esschendal | H02H 3/08 361/62 |
| 2017/0063074 A1* | 3/2017 | Yasusaka | H03K 17/0822 |
| 2018/0152015 A1* | 5/2018 | Cheng | H02H 5/12 |
| 2018/0351015 A1* | 12/2018 | Hopf | H02H 3/025 |
| 2019/0199089 A1* | 6/2019 | Loume | H02H 7/122 |
| 2020/0059082 A1* | 2/2020 | Matsushita | H02H 3/00 |
| 2020/0366079 A1* | 11/2020 | Telefus | H02M 1/08 |

\* cited by examiner

ABNORMAL IMPEDANCE FAULT ISOLATION

BACKGROUND

The present disclosure relates generally to fire detection and alarm systems, and more particularly, to abnormal impedance fault isolation by fire detection and alarm systems.

Typically, fire detection and alarm systems require some type of isolation between different zones (e.g., different floors and/or rooms) of a building. Isolation requirements may allow detection and alarm devices in a first zone to remain enabled and provide continued functionality despite a second zone being disabled due to a detection of a fire or short circuit in the second zone. Isolation of different zones may be accomplished by either separately wiring each zone or by adding isolation circuits to a system having all zones on the same wiring. While isolation circuits may provide lower installation costs (e.g., due to less wiring and labor) and may reduce an overall size of a fire detection and alarm system, as compared to separately wiring each zone, isolation circuits may be susceptible to false positives caused by, for example, electrostatic discharge, lightning strikes, or transient signals (e.g., signals from multiple loads or communications on a line). Accordingly, improvements are desired in fire detection and alarm systems having isolation circuits.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The present disclosure provides systems, apparatuses, and methods for isolating zones in a fire detection system.

In an aspect, an isolation circuit of a fire detection system is described. The isolation circuit may include an isolation switch coupled with a system line of the fire detection system and configured to isolate a first side of the system line from a second side of the system line. The isolation circuit may also include a controller coupled with the isolation switch. The controller may be configured to detect a short circuit on the system line. The controller may also be configured to read a current level signal representing a current level on the system line and a voltage level signal representing a voltage level on the system line in response to detecting the short circuit. The controller may be configured to determine whether one or more detection thresholds are satisfied based on the current level signal and the voltage level signal. The controller may also be configured to control the isolation switch to open or to remain opened to isolate the first side from the second side when the one or more detection thresholds are not satisfied. The controller may further be configured to control the isolation switch to close or to remain closed to not isolate the first side from the second side when the one or more detection thresholds are satisfied.

In another aspect, a method for zone isolation by a fire detection device is described. The method may include detecting a short circuit on a system line of the fire detection system. The method may also include reading a current level signal representing a current level on the system line and a voltage level signal representing a voltage level on the system line in response to detecting the short circuit. The method may include determining whether one or more detection thresholds are satisfied based on the current level signal and the voltage level signal. The method may further include controlling an isolation switch coupled with the system line to open or to remain opened to isolate a first side of the system line from a second side of the system line when the one or more detection thresholds are not satisfied. The method may include controlling the isolation switch to close or to remain closed to not isolate the first side from the second side when the one or more detection thresholds are satisfied.

In another aspect, a computer-readable medium storing computer executable code for zone isolation by a fire detection system is described. The computer-readable medium may include code to detect a short circuit on a system line of the fire detection system. The computer-readable medium may also include code to read a current level signal representing a current level on the system line and a voltage level signal representing a voltage level on the system line in response to detecting the short circuit. The computer-readable medium may further include code to determine whether one or more detection thresholds are satisfied based on the current level signal and the voltage level signal. The computer-readable medium may include code to control an isolation switch coupled with the system line to open or to remain opened to isolate a first side of the system line from a second side of the system line when the one or more detection thresholds are not satisfied. The computer-readable medium may also include code to control the isolation switch to close or to remain closed to not isolate the first side from the second side when the one or more detection thresholds are satisfied.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components may be shown in block diagram form in order to avoid obscuring such concepts.

Aspects of the present disclosure provide systems, methods, and computer-readable medium for zone isolation by a fire detection system. In particular, a fire detection and alarm system may typically use either a voltage-sensing isolator which monitors voltage on a system line and isolates one or more zones of a building based on the voltage, or a current-sensing isolator which monitors current on a system line and isolates a building zone based on the current. However, these types of simple short-circuit isolators fail to accurately and quickly distinguish between different fault scenarios. In other words, these types of isolators are unable to distinguish false positives or false negatives due to changes to characteristics on a system line. For example, system lines not only carry voltage and current for detection and alert devices on the system line but also carry communications between the devices. Accordingly, determining to isolate a zone solely based on the voltage or solely based on the current does not allow a detection and alarm system to distinguish between actual short circuits and false short circuits.

Aspects of the present disclosure may overcome the above-described limitations of simple short-circuit isolators by using multiple data sources in order to pinpoint correct and incorrect boundaries in the functioning of a detection and alarm system. In an example, an isolation circuit is described which uses a combination of current and voltage on a system line to determine an impedance of the system line and determine whether to isolate a building zone based on the impedance. An example of the isolation circuit and components of the isolation circuit used to make decisions corresponding to isolation based on merged data instead of relying on individual parameters are also disclosed herein.

Turning now to the figures, example aspects are depicted with reference to one or more components described herein, where components in dashed lines may be optional.

Figure 1:
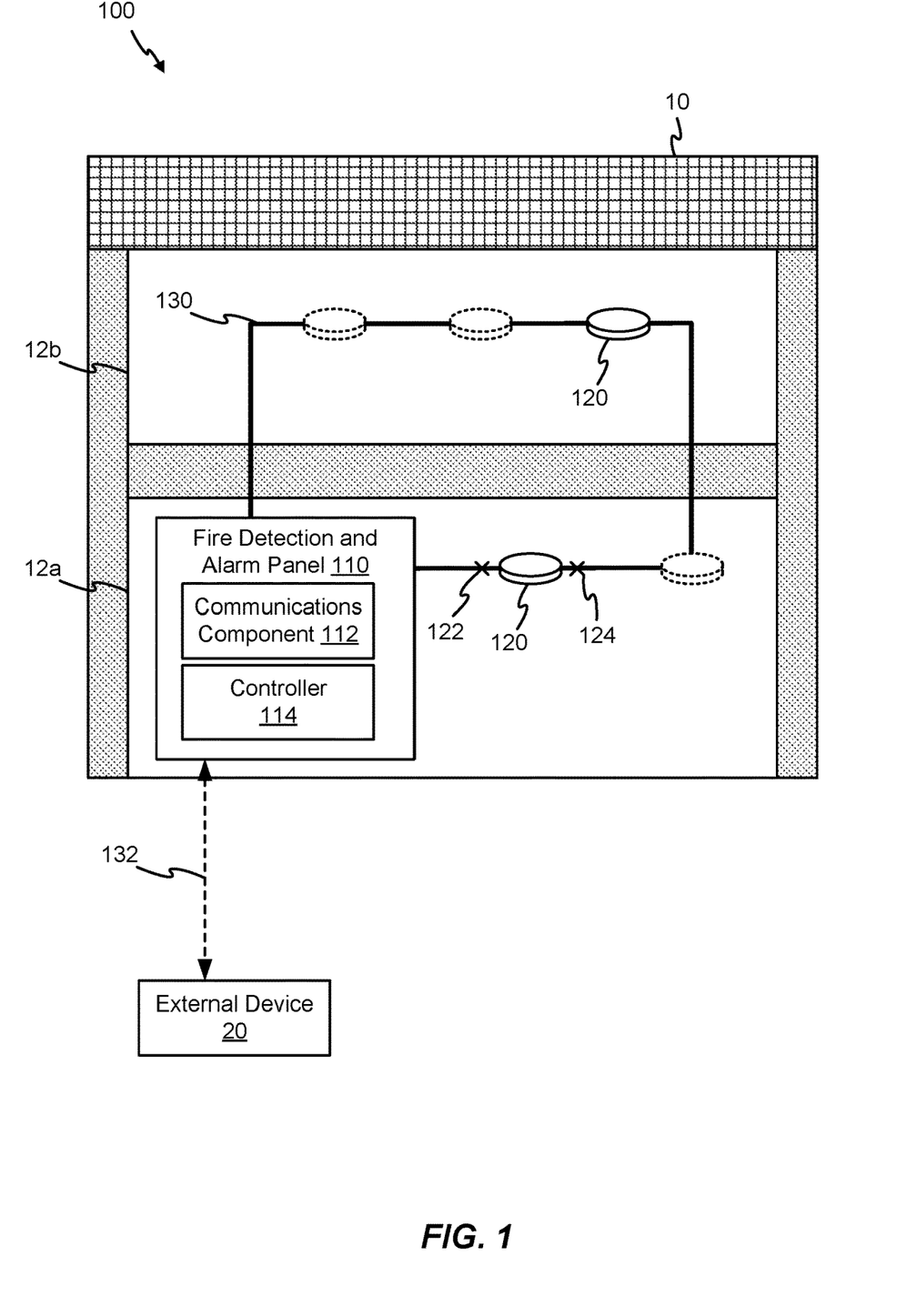
FIG. 1 is a block diagram of an example fire detection system, according to aspects of the present disclosure.

Referring to FIG. 1, a fire detection and alarm system 100 for a building 10 is disclosed. The building 10 may include two or more areas (e.g., rooms or floors) on separate detection and alarm zones 12a, 12b. The detection and alarm system 100 may include a fire detection and alarm panel 110 communicatively coupled with one or more detection devices 120 and configured to receive information from the detection devices 120. Examples of the detection devices 120 may include a smoke detector, a heat detector, or any other type of device for detecting fire and/or smoke.

The fire detection and alarm panel 110 may include a communications component 112 configured to communicate with the one or more detection devices 120 and/or one or more external devices 20. Examples of the external device 20 may include an emergency dispatch system (e.g., fire dispatch or police dispatch), a mobile device such as a cellular phone, a smart phone, a personal digital assistant (PDA), a smart speaker, a computer, or an Internet of Things (IoT) device, a landline phone, or any other device capable of receiving communications including text, talk, and/or data communications.

In an aspect, the communications component 112 may communicate with the one or more detection devices 120 via a system line 130, which may be a wired communications link. As shown by FIG. 1, the system line 130 may form a device loop (e.g., all devices, appliances, and/or panels of the detection and alarm system 100 connected together in a loop). In an aspect the system line may carry power and/or communications between devices, appliances, and/or panels connected to the device loop. Accordingly, in some aspects, one or more of the fire detection and alarm panel 110 or the detection devices 120 may include circuits referred to as initiating device circuits (IDCs) or signaling line circuits (SLCs) which present communications on the system line 130.

The communications component 112 may communicate with the external devices 20 via one or more communications links 132, which may be one or more of a wired communications link or a wireless communications link. In an example, the communications component 112 may include one or more antennas, processors, modems, radio frequency components, and/or circuitry for communicating via a wireline and/or wirelessly with the detection devices 120 and/or the external devices 20.

The fire detection and alarm panel 110 may also include a controller 114 configured to receive information from the one or more detection devices 120 and to determine whether to communicate with the external device 20. Suitable examples of the controller 114 may include, but are not limited to, a processor or plurality of processors in communication with a memory storing computer-readable instructions executable by the processor to perform the control functions described herein. For example, based on communications from one or more of the detection devices 120, the controller 114 may determine to execute instructions for the communications component 112 to alert a local fire or police department, via the external device 20, about a fire.

While the fire detection and alarm system 110 is shown in FIG. 1 as being located in a first zone 12a of the building 10, aspects of the present disclosure do not limit a location of the fire detection and alarm system 110 to this location. For example, the fire detection and alarm system 110 may be located within any zone (e.g., 12a or 12b) of the building 10 or external to the building 10.

As shown by FIG. 1, each of the zones 12a, 12b may include one or more detection devices 120 which are configured to detect a short circuit and determine whether to isolate a zone corresponding to the short circuit based on the detection. A detection device 120 may connect to a first connection point 122 and a second connection point 124 of the system line 130. The first connection point 122 and the second connection point 124 may be locations where wiring of the detection device 120 physically connects to wiring of the system line 130. While FIG. 1 illustrates the first connection point 122 and the second connection point 124 being located exterior to the detection device 120, aspects of the present disclosure are not limited to this location as the first connection point 122 and the second connection point 124 may be located on an interior of the detection device 120. Further details on the detection device 120 are described by FIG. 2.

Figure 2:
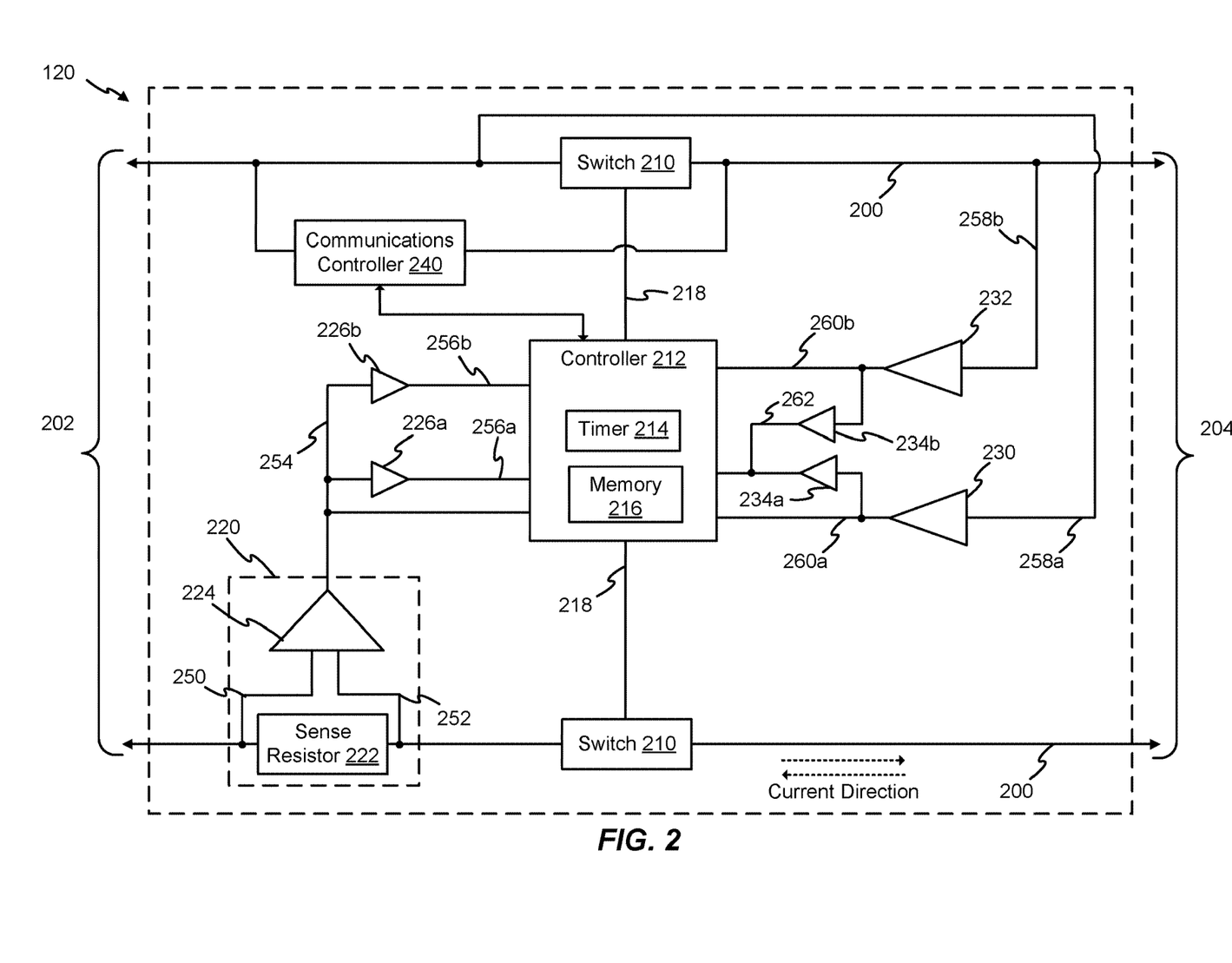
FIG. 2 is a block diagram of an example detection device, according to aspects of the present disclosure.

Referring to FIG. 2, the detection device 120 may include connection interfaces 202, 204 for connecting the detection device 120 to the system line 130, such as at the first connection point 122 and the second connection point 124 (not shown; see FIG. 1). Within the detection device 120, the connection interface 202 may connect to the connection interface 204 via the connection line 200. As voltage and current on the connection line 200 are the same as (or representative of) voltage and current on the system line 130, the connection line 200 may be interchanged with the system line 130 throughout the description of the detection device 120.

In an aspect, the detection device 120 may be bidirectional, meaning the first connection point 122 of the system line 130 may connect to the connection interface 202 and the second connection point 124 of the system line 130 may connect to the connection interface 204 or, alternatively, the first connection point 122 of the system line 130 may connect to the connection interface 204 and the second connection point 124 of the system line 130 may connect to the connection interface 202.

The detection device 120 may include one or more isolation switches 210 connected along the connection line 200. The isolation switches 210 may be configured to open based on a detection of a short circuit on the system line 130. Once opened, the isolation switches 210 may electronically isolate the connection interface 202 from the connection interface 204. In an aspect, the isolation switches 210 may also be coupled with a fault isolation controller 212 via a switch control line 218 and be controlled (e.g., opened or closed) by the fault isolation controller 212. For example, the isolation switches 210 may receive a logic level signal from the fault isolation controller 212 via the switch control line 218 to open or close the isolation switches 210. In an example, the logic level signal may be a transistor-transistor logic (TTL) signal or complementary metal-oxide-semiconductor (CMOS) logic level signal. Examples of the isolation switches 210 may include a field-effect transistor (FET) such as a metal-oxide-semiconductor (MOSFET) or junction FET (JFET), a relay such as an electro-magnetic relay, or any other type of electronic or electro-mechanical switch.

The detection device 120 may also include the fault isolation controller 212 coupled with a current monitor 220 and voltage monitors 230, 232. The current monitor 220 may be configured to monitor current on the connection line 200 and to provide an output signal (current level signal) corresponding to the current of the connection line 200 to the fault isolation controller 212. In an example, the current monitor 220 may include two input signal lines 250, 252 connected to the connection line 200 and an output signal line 254 connected to the fault isolation controller 212. The current monitor 220 may include a current sense amplifier 224 connecting to the two input signal lines 250, 252. The current monitor 220 may also include a sense resistor 222 connected along the connection line 200 between the two input signal lines 250, 252. The current sense amplifier 224 may be configured to measure the current on the connection line 200 based on the sense resistor 222, and to provide a signal (current level signal) on the output signal line 254 to the fault isolation controller 212. The signal on the output signal line 254 may be a voltage representative of the detected current on the connection line 200. In an example, when a short circuit occurs on the system line 130, the current monitor 220 may detect a change in the current along the connection line 200 thereby an output signal (e.g., output in voltages) of the current monitor 220 may change based on the change in current. For example, a normal output signal on the output signal line 254 may be at a baseline voltage (e.g., 2.5 volts (V)), and when a voltage on the output signal line 254 increases (e.g., towards 5V) or decreases (e.g., towards 0V), the change in the voltage on the output signal line 254 is representative of the change in the current on the connection line 200.

For example, when a short circuit occurs on the system line 130, the current detected by the current monitor 220 may increase resulting in the output signal (e.g., a voltage level) on the output signal line 254 to increase/decrease depending on a location of the short circuit. For example, if a short circuit occurs on the side of the communication interface 202, the current on the detection line 200 may increase in the direction of the communication interface 204 towards the communication interface 202 (e.g., right to left in FIG. 2), and if a short circuit occurs on the side of the communication 204, the current on the detection line 200 may increase in the direction of the communication interface 202 towards the communication interface 204 (e.g., left to right in FIG. 2).

Further, a normal output signal of the current monitor 220 may be at a baseline voltage (e.g., 2.5V). Accordingly, when the voltage on the output signal of the current monitor 220 increases from the baseline voltage (e.g., increases from 2.5V towards 5V), this may indicate a short circuit on the side of the communication interface 204 (i.e., current increase in direction of the communication interface 202 towards the communication interface 204), and when the voltage on the output signal of the current monitor 220 decreases from the baseline voltage (e.g., decreases from 2.5V towards 0V), this may indicate a short circuit on the side of the communication interface 202 (i.e., current increase in the direction of the communication interface 204 towards the communication interface 204).

In an aspect, the detection device 120 may also include one or more current comparators 226a and/or 226b. The current monitor 220 may be coupled with the current comparators 226a and/or 226b via the output signal line 254, as shown by FIG. 2. The current comparators 226a, 226b may be configured to receive an output signal of the current monitor 220, compare the output signal to one or more current thresholds, and provide a wake-up signal and an indication of which side of the detection device 120 a short circuit occurred on the system line 130 to the fault isolation controller 212 based on the comparison. In an example, the one or more current thresholds may include a reference voltage received by the current comparators 226a, 226b. system line For example, the current comparator 226a may receive an output signal of the current monitor 220 via the output signal line 254 and compare the output signal of the current monitor 220 to a first current threshold (e.g., 3.566V). If the output signal of the current monitor 220 is greater than the first current threshold, the current comparator 226a may send a first current alert signal on the current alert line 256a to the fault isolation controller 212. In an example, the first current alert signal from the current comparator 226a may trigger the fault isolation controller 212 to change from a sleep mode to an awake mode. Further, since the current comparator 226a triggered the fault isolation controller 212, the first current alert signal may also be an indication to the fault isolation controller 212 that a short circuit occurred on the side of the communication interface 204 based on an increase in current from the communication interface 202 to the communication interface 204 on the detection line 200.

In another example, the current comparator 226b may receive an output signal of the current monitor 220 via the output signal line 254 and compare the output signal of the current monitor 220 to a second current threshold (e.g., 1.43V). If the output signal of the current monitor 220 is less than the second current threshold, the current comparator 226b may send a second current alert signal on the current alert line 256b to the fault isolation controller 212. In an example, the second current alert signal may trigger the fault isolation controller 212 to change from a sleep mode to an awake mode. Further, since the current comparator 226a triggered the fault isolation controller 212, the second current alert signal may be an indication to the fault isolation controller 212 that a short circuit occurred on the side of the communication interface 202 based on an increase in current from the communication interface 204 to the communication interface 202 on the detection line 200.

The voltage monitors 230, 232 may be configured to monitor voltage on the system line 130 via connection line 200, and provide voltage output signals to the fault isolation controller 212. In an aspect, input lines 258a, 258b of the voltage monitors 230, 232 may connect to the connection lines 200 and output lines 260a, 260b of the voltage monitors 230, 232 may connect to the fault isolation controller 212. The voltage monitor 230 may monitor voltage on the system line 130 at the connection interface 202 side of the detection device 120, and the voltage monitor 232 may monitor voltage on the system line 130 at the connection interface 204 side of the detection device 120.

In an aspect, the detection device 120 may also include one or more voltage comparators 234a and/or 234b. As shown by FIG. 2, the voltage comparators 234a, 234b may receive the output signals on output lines 260a, 260b of the voltage monitors 230, 232, respectively. The voltage comparators 234a, 234b may then compare the received signal of one or more of the output lines 260a, 260b to a voltage threshold. Further, based on the voltage comparison, the voltage comparators 234a, 234b may provide a voltage alert signal on a voltage alert line 262 connected to the fault isolation controller 212 to indicate a voltage level on the connection interface 202 side and/or on the connection interface 204 side does not satisfy the voltage threshold. For example, when a short circuit is on the system line 130, the voltage level on the output signals of one or more of the output lines 260a, 260b may be below the voltage threshold. As shown by FIG. 2, outputs of the voltage comparators 234a, 234b may be tied together.

As described herein, the fault isolation controller 212 may connect to output lines of the current monitor 220, the voltage monitors 230, the current comparators 226a, 226b, and the voltage comparators 234a, 234b. In an example, the output lines of the current monitor 220 and the voltage monitors 230 may connect to analog to digital conversion (ADC) pins of the fault isolation controller 212 and outputs of the current comparators 226a, 226b and the voltage comparators 234a, 234b may connect to alert or interrupt pins.

The fault isolation controller 212 may contain instructions or logic to open (e.g., isolate communication interface 202 from communication interface 204) or close (e.g., communicatively couple communication interface 202 with communication interface 204) the isolation switches 210 based on output signals received from the current monitor 220, the voltage monitors 230, the current comparators 226a, 226b, and the voltage comparators 234a, 234b. In an example, the instructions or logic may be stored in memory 216 of the fault isolation controller 212. The fault isolation controller 212 may read the output signal from the current monitor 220 and the output signals from the voltage monitors 260a, 260b, determine whether an actual short circuit is on the system line 130 or not, and, based on the determination, may control the isolation switches to be opened or closed.

In some examples, the fault isolation controller 212 may receive an indication of the short circuit via one or more of the current monitor 220, the voltage monitors 230, 232, the current comparators 226a, 226b, or the voltage comparators 234a, 234b. For example, the fault isolation controller 212 may receive an indication of the short circuit from the current comparators 226a, 226b via the current alert lines 256a, 256b, respectively, or from the voltage comparators 234a, 234b via the voltage alert line 262. In another example, the fault isolation controller 212 may receive an indication of the short circuit based on the current level signal received from the current monitor 220 via the output signal line 254, or based on the voltage level signal received from the voltage monitors 230, 232 via voltage output lines 260a, 260b.

Once the indication of the short circuit is received, the fault isolation controller 212 may read the output signal from the current monitor 220 and the output signals from the voltage monitors 260a, 260b and determine whether or not an actual short circuit is on the system line 130. In some examples, the fault isolation controller 212 may compare the current level signal and the voltage level signal to one or more detection thresholds (including current detection thresholds and voltage detection thresholds) to determine whether or not an actual short circuit is on the system line 130. In an example, the one or more detection thresholds may represent current and/or voltage of a normal load on the system line 130. In an example, one or more of the detection thresholds may be a value stored in the memory 216 and may be based on one or more of a typical line voltage, a permitted line length, or permitted line loading devices.

For example, the fault isolation controller 212 may determine that a short circuit is on the system line 130 based on the current level signal indicating that a current level is greater than a first current detection threshold (e.g., 0.45 Amps). In another example, the fault isolation controller 212 may determine that a short circuit is on the system line 130 based on a detection of an abnormal impedance when the current level signal indicates that the current level is less than the first current detection threshold (e.g., 0.45 Amps) but greater than a second current detection threshold (e.g., 0.35 Amps) and a voltage level signal indicates a voltage level is less than a first voltage detection threshold (e.g., 14V) and more than a second voltage detection threshold (e.g., 8.8V). In another example, the fault isolation controller 212 may determine that a short circuit is on the system line 130 based on an open wiring fault when the current level signal indicates that the current voltage level is less than the second current detection threshold (e.g., 0.35 Amps) and the voltage level signal indicates that the voltage level is less than the second voltage detection level (e.g., 8.8V).

Because the fault isolation controller 212 relies on both current and voltage to determine whether a short circuit occurred on the system line 130, the detection device 120 is able to be more robust than devices that only monitor a single input. For example, in comparison with a typical detection device, the detection device 120 may distinguish between an actual short circuit and false positives/negatives (e.g., due to communications on system line 130).

Based on the determination of a short circuit, the fault isolation controller 212 may open or close the isolation switches 210. As an example, the fault isolation controller 212 may send a control signal, such as a TTL signal or CMOS logic level signal, corresponding to opening or closing the isolation switches 210. In an aspect, the control signal may be sent via switch control line 218.

In some aspects, the fault isolation controller 212 may contain a timer 214 for providing additional time for the detection device 120 to verify whether the short circuit is an actual short circuit through repetition of current and voltage readings. The timer may be configured to initiate when a first current level signal or voltage level signal is read and expire after a time period. After the expiration of the timer, the fault isolation controller 212 may read the current level signal and/or the voltage level signal again based on output signals of the current monitor 220 and the voltage monitors 258a, 258*b*. In some examples, the time period may be any amount of time. In an example, the time period may be an amount of time stored in memory 216.

In some aspects, the fault isolation controller 212 may transition from a sleep mode to an awake mode based on received alert signals from the current comparators 226*a*, 226*b* and/or the voltage comparators 234*a*, 234*b*. For example, the fault isolation controller 212 may conserve power by resorting to a sleep mode until the fault isolation controller 212 receives an alert signal from either the current comparators 226*a*, 226*b* and/or the voltage comparators 234*a*, 234*b*. The alert signal may function as an indication of a potential short circuit on the system line 130 and a wake-up signal to the fault isolation controller 212.

As described herein, the current comparators 226*a*, 226*b* may indicate to the fault isolation controller 212 which side of the detection device 120 a short circuit occurred on the system line 130 (e.g., communication interface 202 side or communication interface 204 side). For example, when the fault isolation controller 212 receives a current alert signal from the current comparator 226*a*, the fault isolation controller 212 may determine that a short circuit occurred on the communication interface 204 side. In another example, when the fault isolation controller 212 receives a current alert signal from the current comparator 226*b*, the fault isolation controller 212 may determine that a short circuit occurred on the communication interface 202 side.

In an aspect, the detection device 120 may include a communications controller 240 configured to communicate via the system line 130 with one or more detection devices 120 and/or the detection and alarm panel 110. In an example, the fault isolation controller 212 may send or receive communications via the communications controller 240 indicating operations performed by the detection device 120 such as detection of a short circuit, calculation of impedance, or determination that the short circuit is a false short circuit or an actual short circuit, or any other communication.

Figure 3:
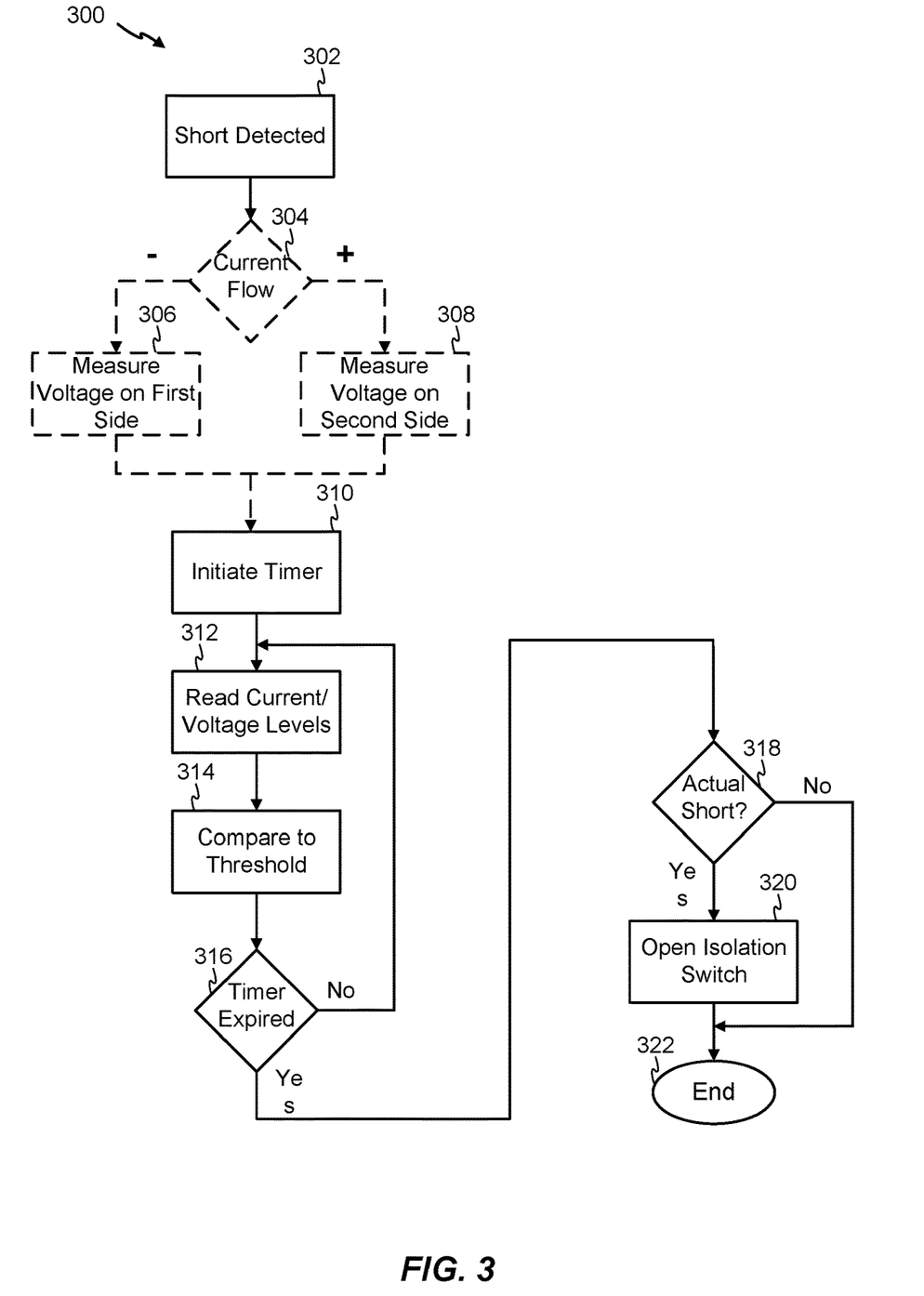
FIG. 3 is a flowchart of an example of logic operations, according to aspects of the present disclosure.

Referring to FIG. 3, an example of logic operations 300 for the fault isolation controller 212 is described. Initially, at 302, the fault isolation controller 212 may receive an indication of a short circuit being detected. As described herein, the fault isolation controller 212 may receive the indication from one or more of the current comparators 226*a*, 226*b* or voltage comparators 234*a*, 234*b*. At 304, the fault isolation controller 212 may optionally determine the direction of current flow. In an example, the direction of current flow may be determined by the fault isolation controller 212 based on whether a current alert signal is received from the current comparator 226*a* or 226*b*. For example, the fault isolation controller 212 may receive a current alert signal from the current comparator 226*a* which indicates that current is flowing towards the communication interface 204 (i.e., a short circuit is on the side of the communication interface 204) In another example, the fault isolation controller 212 may receive a current alert signal from the current comparator 226*b* which indicates that current is flowing towards the communication interface 202 (i.e., a short circuit is on the side of the communication interface 202). Based on the current alert signal, the fault isolation controller 212, at 306, may measure a voltage on a first side (e.g., connection interface 202 side) of the detection device 120 via the voltage monitor 230, or, at 308, may measure a voltage on a second side (e.g., connection interface 204 side) of the detection device 120 via the voltage monitor 232.

At 310, the fault isolation controller 212 may initiate the timer 214 to allow the fault isolation controller 212 time to read one or more current/voltage levels and compare the current/voltage levels to one or more detection thresholds. At 312, the fault isolation controller 212 may read second current/voltage levels a first time based on the current from the current monitor 220 and the voltage from one of the voltage monitors 230 or 232. At 314, the fault isolation controller 212 may compare the current/voltage levels to one or more detection thresholds, as described herein.

At 316, the fault isolation controller 212 may then determine whether the timer 214 has expired. If the timer 214 has not expired, the fault isolation controller 212 may repeat reading of current/voltage at 312 and comparison to detection thresholds at 314 using updated currents and voltages (i.e., obtained at a second time, third time, etc.) unit the timer 214 has expired.

Once the timer 214 has expired, at 318, the fault isolation controller 212 may determine whether an actual short circuit occurred based on the multiple readings and comparisons. In an example, if a most recent calculated impedance is within one or more detection thresholds, the fault isolation controller 212 may determine that the short circuit is an actual short circuit. In another example, if a percentage of abnormal impedance readings are within the detection thresholds, the fault isolation controller 212 may determine that the short circuit is an actual short circuit. In another example, if M readings out of a total of N readings, where N and M are integers and M is less than N, are abnormal impedance readings, the fault isolation controller 212 may determine that the short circuit is an actual short circuit. In another example, if the readings indicate that the system line 130 transitioned from a short circuit to an open circuit, the fault isolation controller 212 may determine that the short circuit was an actual short circuit. For any of these examples, at 320, the fault isolation controller 212 may then send a control signal to the isolation switches 210 have the isolation switches 210 opened. After opening the isolation switches 210, the operations will end at 322. Otherwise, at 318, the fault isolation controller 212 may determine that the short circuit is a false short circuit and the operations end at 322.

Figure 4:
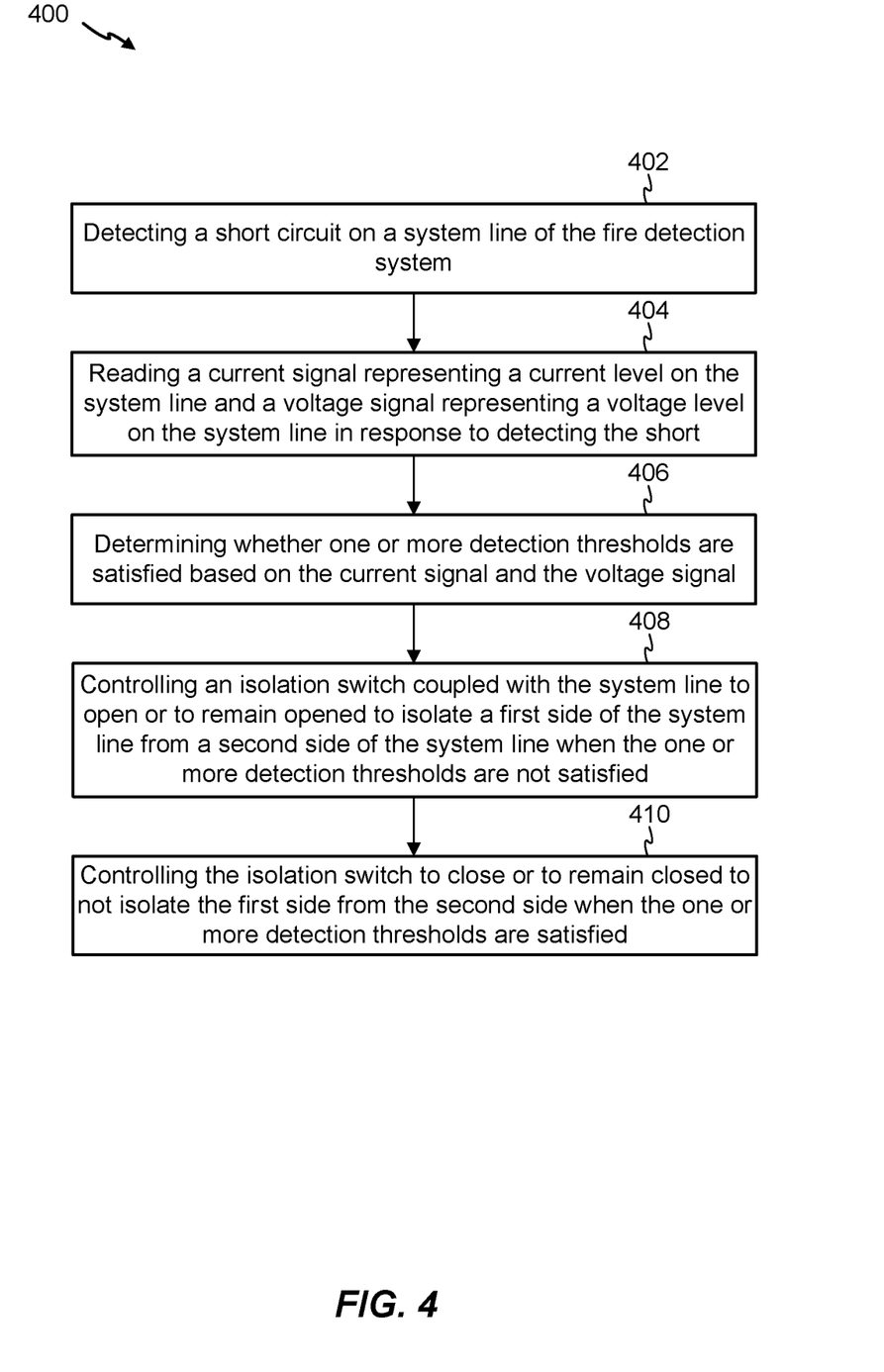
FIG. 4 is a flowchart of an example method, according to aspects of the present disclosure.

Referring to FIG. 4, an example of a method 400 for isolating zones of a fire detection system is disclosed. The method 400 may implement the functionality described herein with reference to FIGS. 1-3 and may be performed by one or more components of the detection device 120 as described herein.

At 402, the method 400 may include detecting a short circuit on a system line of the fire detection system. For example, the fault isolation controller 212 may detect a short circuit on the system line 130 of the fire detection system 100. Detection by the fault isolation controller 212 may be based on one or more signals from the current comparators 226*a*, 226*b*, the voltage comparators 234*a*, 234*b*, the current monitor 220, or the voltage monitors 230, 232.

At 404, the method 400 may include reading a current level signal representing a current level on the system line and a voltage level signal representing a voltage level on the system line in response to detecting the short circuit. For example, the fault isolation controller 212 may read a current level signal from the current monitor 220, where the current level signal represents a current level on the system line 130, and the fault isolation controller 212 may read a voltage level signal from one or more of the voltage monitors 230, 232, where the voltage level signal represents a voltage level on the system line 130.

At 406, the method 400 may include determining whether one or more detection thresholds are satisfied based on the current level signal and the voltage level signal. For example, the fault isolation controller 212 may determine whether one or more detection thresholds are satisfied based on the current level signal and the voltage level signal from the current monitor 220 and the voltage monitors 230, 232. In an example, the one or more detection thresholds may represent current and/or voltage of a normal load on the system line 130 and/or may include values stored in the memory 216 indicating on one or more of a typical line voltage, a permitted line length, or permitted line loading devices. The fault isolation controller 212 may determine whether one or more detection thresholds are satisfied by comparing the one or more detection thresholds to the current level signal and the voltage level signal.

At 408, the method 400 may also include controlling an isolation switch coupled with the system line to open or to remain opened to isolate a first side of the system line from a second side of the system line when the one or more detection thresholds are not satisfied. For example, the fault isolation controller 212 may send a control signal to the isolation switches 210 to open or remain open such that the communication interface 202 side connected to the system line 130 is isolated from the communication interface 204 side. In an example, the fault isolation controller 212 may send the control signal (e.g., logic level signal) via switch control line 218 to the isolation switch 210 to open the isolation switch 210.

At 410, the method 400 may include controlling the isolation switch to close or to remain closed to not isolate the first side from the second side when the one or more detection thresholds are satisfied. For example, the fault isolation controller 212 may send a control signal to the isolation switches 210 to close or to remain closed such that the communication interface 202 side connected to the system line 130 is not isolated from the communication interface 204 side.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An isolation circuit of a fire detection system, comprising:
   an isolation switch coupled with a system line of the fire detection system and configured to isolate a first side of the system line from a second side of the system line;
   a current monitor coupled with the system line configured to measure a current level on the system line;
   a voltage monitor coupled with the first side of the system line and the second side of the system line, and configured to measure a voltage level on the system line, the voltage monitor being different from the current monitor; and
   a controller coupled with the isolation switch, the current monitor, and the voltage monitor and configured to:
      detect a short circuit on the system line;
      determine whether the short circuit occurred on the first side of the system line or the second side of the system line;
      receive a current level signal representing the current level on the system line from the current monitor and a voltage level signal representing the voltage level on the system line from the voltage monitor, in response to detecting the short circuit on the first side of the system line;
      determine whether the short circuit on the first side of the system line is false or not based on a current threshold being satisfied by the current level signal and a voltage threshold being satisfied by the voltage level signal;
      control the isolation switch to open or to remain opened to isolate the first side of the system line from the second side of the system line in response to one of the current threshold or the voltage threshold not being satisfied; and
      control the isolation switch to close or to remain closed to not isolate the first side of the system line from the second side of the system line in response to the current threshold and the voltage threshold being satisfied.

2. The isolation circuit of claim 1, further comprising:
   a comparator coupled between the current monitor and the controller and configured to receive the current level signal from the current monitor and provide a current alert signal to the controller in response to the current threshold not being satisfied.

3. The isolation circuit of claim 2, wherein the controller is further configured to:
   transition from a sleep mode to an awake mode or remain in the awake mode based on the current alert signal provided from the comparator.

4. The isolation circuit of claim 2, wherein the controller is further configured to:
   determine the first side of the system line is closer to the short circuit than the second side of the system line based on the current alert signal provided from the comparator.

5. The isolation circuit of claim 1, further comprising:
   a timer configured to initiate at a first time in response to the current level signal and the voltage level signal being reviewed and to expire at a second time in response to a time period being satisfied.

6. The isolation circuit of claim 5, wherein the controller is further configured to:
receive a second current level signal representing a second current level on the system line at the second time and a second voltage level signal representing a second voltage level on the system line at the second time; and
determine whether the short circuit is false or not is further based on the second current level signal and the second voltage level signal.

7. The isolation circuit of claim 1, wherein the voltage monitor comprises:
a first voltage monitor to measure a first voltage level at the first side of the system line; and
a second voltage monitor to measure a second voltage level at the second side of the system line,
wherein the controller is further configured to determine whether the short circuit is false or not is further based on one or more of the first voltage level or the second voltage level.

8. A method for zone isolation by a controller of an isolation circuit of a fire detection system, comprising:
detecting a short circuit on a system line of the fire detection system;
determining whether the short circuit occurred on a first side of the system line or a second side of the system line;
receiving a current level signal representing a current level on the system line from a current monitor of the isolation circuit coupled with the system line and a voltage level signal representing a voltage level on the system line from a voltage monitor of the isolation circuit coupled with the system line, in response to detecting the short circuit on the first side of the system line;
determining whether the short circuit on the first side of the system line is false or not based on a current threshold being satisfied by the current level signal and a voltage threshold being satisfied by the voltage level signal;
controlling an isolation switch of the isolation circuit coupled with the system line to open or to remain opened to isolate the first side of the system line from the second side of the system line in response to one of the current threshold or the voltage threshold not being satisfied; and
controlling the isolation switch to close or to remain closed to not isolate the first side of the system line from the second side of the system line in response to the current threshold and the voltage threshold being satisfied.

9. The method of claim 8, further comprising:
receiving, by a comparator coupled between the current monitor and the controller, the current level signal from the current monitor; and
providing a current alert signal to the controller in response to the current threshold not being satisfied.

10. The method of claim 9, further comprising:
transitioning, by the controller, from a sleep mode to an awake mode or remaining in the awake mode based on the current alert signal provided from the comparator.

11. The method of claim 8, further comprising:
determining the first side of the system line is closer to the short circuit than the second side of the system line based on a current alert signal provided from a comparator.

12. The method of claim 8, further comprising:
initiating a timer at a first time in response to the receiving of the current level signal and the voltage level signal; and
stopping the timer at a second time in response to a time period being satisfied.

13. The method of claim 12, further comprising:
receiving a second current level signal representing a second current level on the system line at the second time and a second voltage level signal representing a second voltage level on the system line at the second time; and
determining whether the short circuit is false or not is further based on the second current level signal and the second voltage level signal.

14. The method of claim 8, wherein the voltage monitor comprises a first voltage monitor and a second voltage monitor, wherein the method further comprises:
monitoring, by the first voltage monitor, a first voltage at the first side of the system line;
monitoring, by the second voltage monitor, a second voltage at the second side of the system line; and
determining whether the short circuit is false or not is further based on one or more of the first voltage or the second voltage.

15. A computer-readable medium storing computer executable code for zone isolation by a controller of an isolation circuit of a fire detection system, comprising code to:
detect a short circuit on a system line of the fire detection system;
determine whether the short circuit occurred on a first side of the system line or a second side of the system line;
receive a current level signal representing a current level on the system line from a current monitor of the isolation circuit coupled with the system line and a voltage level signal representing a voltage level on the system line from a voltage monitor of the isolation circuit coupled with the system line, in response to detecting the short circuit on the first side of the system line;
determine whether the short circuit on the first side of the system line is false or not based on a current threshold being satisfied by the current level signal and a voltage threshold being satisfied by the voltage level signal;
control an isolation switch of the isolation circuit coupled with the system line to open or to remain opened to isolate the first side of the system line from the second side of the system line in response to one of the current threshold or the voltage threshold not being satisfied; and
control the isolation switch to close or to remain closed to not isolate the first side of the system line from the second side of the system line in response to the current threshold and the voltage threshold being satisfied.

16. The computer-readable medium of claim 15, further comprising code to:
transition from a sleep mode to an awake mode or remain in the awake mode in response to an alert signal being received from one or more of the current monitor or the voltage monitor.

* * * * *